United States Patent
Ngo et al.

(10) Patent No.: US 7,118,967 B1
(45) Date of Patent: Oct. 10, 2006

(54) PROTECTION OF CHARGE TRAPPING DIELECTRIC FLASH MEMORY DEVICES FROM UV-INDUCED CHARGING IN BEOL PROCESSING

(75) Inventors: Minh V. Ngo, Fremont, CA (US); Ning Cheng, Cupertino, CA (US); Jeff P. Erhardt, San Jose, CA (US); Clarence B. Ferguson, San Jose, CA (US); Cyrus Tabery, Sunnyvale, CA (US); John Caffall, San Carlos, CA (US); Tyagamohan Gottipati, Sunnyvale, CA (US); Dawn Hopper, San Jose, CA (US)

(73) Assignee: Spansion, LLC, Sunnyvale, CA (US)

( * ) Notice: Subject to any disclaimer, the term of this patent is extended or adjusted under 35 U.S.C. 154(b) by 516 days.

(21) Appl. No.: 10/368,696

(22) Filed: Feb. 19, 2003

(51) Int. Cl.
*H01L 21/336* (2006.01)

(52) U.S. Cl. ............ 438/261; 438/954; 438/257; 438/258; 438/259; 438/260; 438/262; 438/263; 438/264; 438/265; 438/266

(58) Field of Classification Search ........ 438/257–267, 438/954; 257/314–320
See application file for complete search history.

(56) References Cited

U.S. PATENT DOCUMENTS

| | | | |
|---|---|---|---|
| 5,519,246 A * | 5/1996 | Shirota et al. | 257/435 |
| 5,714,412 A * | 2/1998 | Liang et al. | 438/266 |
| 5,863,462 A | 1/1999 | Riedel et al. | 252/315.1 |
| 5,935,705 A | 8/1999 | Chen et al. | 428/367 |
| 6,090,358 A | 7/2000 | Chen et al. | 423/324 |
| 6,198,216 B1 | 3/2001 | Kosa et al. | 313/503 |
| 6,417,053 B1 * | 7/2002 | Kuo | 438/287 |
| 6,444,568 B1 | 9/2002 | Sundararajan et al. | 438/627 |
| 6,656,785 B1 * | 12/2003 | Chiang et al. | 438/240 |
| 6,709,874 B1 * | 3/2004 | Ning | 438/3 |

OTHER PUBLICATIONS

Liew; "Fabrication of SiCN Ceramic MEMS Using Injectable Polymer-Precursor Technique"; Sensors and Actuators A 89 (2001) 64-70.
Liew; "Fabrication of Multi-Layered SiCN Ceramic MEMS Using Photo-Polymerization of Precursor"; NSF Center for Advanced Manufacturing and Packaging of Microwave, Optical and Digital Electronics (CAMPmode), Department of Mechanical Engineering, University of Colorado.
Liew; "Fabrication of SiCN MEMS by Photopolymerization of Pre-Ceramic Polymer"; Sensors and Actuators A 95 (2002) 120-134.
Wei et al.; "Growth of SiCN Films by Magnetron Sputtering"; 2000 IoM Communications Ltd. Surface Engineering, 2000, 16, (2), 225-228.
Product Data Sheet; Ceraset™ Polyureasilazane; Product Sheet Issue Date: Jan. 19, 2001.

* cited by examiner

*Primary Examiner*—Douglas W. Owens
*Assistant Examiner*—Samuel Gebremariam
(74) *Attorney, Agent, or Firm*—Renner, Otto, Boisselle & Sklar, LLP

(57) ABSTRACT

A method of protecting a charge trapping dielectric flash memory cell from UV-induced charging, including fabricating a charge trapping dielectric flash memory cell including a charge trapping dielectric charge storage layer in a semiconductor device; and during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell. In one embodiment, the step of protecting is carried out by selecting processes in BEOL fabrication which do not include use, generation or exposure of the semiconductor device to a level of UV radiation sufficient to deposit the non-erasable charge.

20 Claims, 5 Drawing Sheets

PROTECTION OF CHARGE TRAPPING DIELECTRIC FLASH MEMORY DEVICES FROM UV-INDUCED CHARGING IN BEOL PROCESSING

TECHNICAL FIELD

The present invention relates to a process for preparation of a charge trapping dielectric flash memory device including protection of the device from UV-induced charging in back-end-of-line (BEOL) processing. More specifically, the present invention relates to selection and use of processes in BEOL processing which do not result in exposure of charge trapping dielectric materials to UV radiation sufficient to deposit a non-erasable charge in the dielectric charge storage structure.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge trapping dielectric, for example, silicon nitride in an oxide-nitride-oxide (ONO) structure. One EEPROM device that utilizes a charge trapping dielectric charge storage layer is a silicon-oxide-nitride-oxide-silicon (SONOS) type cell. In other such devices, the charge storage is in a charge trapping dielectric layer, but the materials of the various layers may vary from those used in SONOS devices. That is, the silicon, the oxide and/or the nitride of the respective layers may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric charge storage devices, during programming, electrical charge is transferred from the substrate to the charge trapping dielectric charge storage layer in the device, e.g., the nitride layer in a SONOS device. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge trapping dielectric layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the charge trapping dielectric layer near the source region. Because the charge trapping dielectric material is not electrically conductive, the charge introduced into the charge trapping dielectric layer tends to remain localized. Accordingly, depending upon the application of voltage potentials, electrical charge can be stored in discrete regions within a single continuous charge trapping dielectric charge storage layer.

Non-volatile memory designers have taken advantage of the localized nature of electron storage within a charge trapping dielectric layer and have designed memory circuits that utilize two or more regions of stored charge within the charge storage layer. This type of non-volatile memory device is known as a dual-bit or multi-bit EEPROM. A dual-bit EEPROM is available under the trademark MIRRORBIT™ from Advanced Micro Devices, Inc., Sunnyvale, Calif. The MIRRORBIT™ dual-bit EEPROM is capable of storing twice as much information as a conventional EEPROM in a memory array of equal size. A left bit and a right bit are stored in physically different areas of the silicon nitride layer, in left and right regions of each memory cell, respectively. The above-described programming methods are used to enable the two bits to be programmed and read simultaneously. Each of the two bits of the memory cell can be individually erased by applying suitable erase voltages to the gate and to either the source or drain regions. The multi-bit memory cells recently have been developed, in which more than two bits can be stored in separate regions of a single charge storage layer of the flash EEPROM memory cell. As used herein, the term "dual-bit" refers to both dual-bit and higher-bit memory cells, unless otherwise specifically stated.

A key concept associated with the charge trapping dielectric flash memory device is that for the device to operate properly, both bits must be able to be written and read separately. If one of the bits is programmed, a reverse read on the programmed bit must sense a high $V_t$, and a reverse read on the non-programmed bit must sense a low $V_t$. Thus, a reverse read on the non-programmed bit, which is equivalent to a forward read on the programmed bit, must punch through the region of trapped charge in order to generate a high enough read current. If this does not happen, the non-programmed bit will not be able to be read as a conductive bit.

The present inventors have discovered a problem with charge trapping dielectric flash memory devices including a dielectric charge storage layer is the buildup of charge in the charge storage layer, and subsequent increases in $V_t$, as a result of exposure to ultraviolet radiation during fabrication, and particularly in BEOL process steps, i.e., following formation of the flash memory cell. Processes which include high levels of UV radiation cause such charge buildup and concomitant increase in $V_t$. This increase in $V_t$ would make all the bits appear to be high, i.e., "0". In addition, if the charge buildup is sufficiently large, it cannot be easily erased by the available voltages. As a result, the charge trapping dielectric device would be rendered useless as a charge storage device.

UV exposure is not a problem for floating gate flash devices which have a polysilicon or other conductive material for a charge storage element. In such devices, the floating gate may be purposely exposed to UV radiation, in order to neutralize any electronic charge which builds up on the floating gate memory cell during processing. For example, U.S. Pat. No. 6,350,651 uses UV radiation in this manner.

Such processing is not an option for charge trapping dielectric flash memory devices, since the dielectric charge storage layer can be irreversibly damaged by exposure to UV radiation which builds up a large charge, and the charge cannot be neutralized by further exposure to UV radiation.

Therefore, a need exists for a method which will provide protection of the dielectric charge storage layer in charge trapping dielectric devices from exposure to UV radiation during BEOL processing. Accordingly, advances in such fabrication technology are needed to insure that charge buildup and increase in $V_t$ in charge trapping dielectric structures does not occur, particularly during BEOL processing.

DISCLOSURE OF INVENTION

The present invention, in one embodiment, relates to a process for protecting a charge trapping dielectric flash memory cell from UV-induced charging, including fabricating a charge trapping dielectric flash memory cell including a charge trapping dielectric charge storage layer in a semiconductor device; and during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell. In one embodiment, the step of protecting is carried out by selecting processes in BEOL fabrication which do not include use, generation or exposure of the semiconductor device to a level of UV radiation sufficient to deposit the non-erasable charge. In the present invention, a non-erasable charge is a charge which cannot be erased when a voltage sufficient to erase a bit of data written in the cell is applied to the charge trapping dielectric flash memory cell.

In another embodiment, the present invention relates to a method of protecting a charge trapping dielectric flash memory cell from UV-induced charging, including fabricating a charge trapping dielectric flash memory cell including a charge trapping dielectric charge storage layer in a semiconductor device; and during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell, wherein the subsequent processing steps comprise deposition over the charge trapping dielectric flash memory cell of one or more of an interlayer dielectric layer, a cap layer and a device top dielectric layer by APCVD, CVD or a spin-on method. Unlike conventional methods used during BEOL processing, these methods do not include use of UV radiation.

Thus, the present invention, by protecting the device from UV-induced charging, overcomes the problem of UV-induced charging of charge trapping dielectric flash memory cells, particularly during BEOL processing, subsequent to formation of the dielectric charge storage layer. The present invention provides advantages such as (1) selection of processes which do not use, generate or expose the device to UV radiation; (2) protecting the charge trapping dielectric flash memory cell from UV-induced charging; (3) a process modification which can be easily accommodated in presently employed fabrication processes; and (4) providing alterative low-K interlevel dielectric layers. Thus, the present invention provides an advance in ONO fabrication technology, and insures proper charge isolation in dielectric charge storage structures such as ONO structures in charge trapping dielectric flash memory devices, while at the same time providing distinct process and economic advantages. Although described in terms of, and particularly applicable to, SONOS-type charge trapping dielectric flash memory devices, the present invention is broadly applicable to fabrication of any charge trapping dielectric flash memory device that includes a dielectric charge storage layer subject to unwanted UV charging. For example, sunken-gate flash memory cells having sidewall dielectric charge storage structures are within the scope of the dielectric charge storage layer described in the present disclosure.

Figure 1:
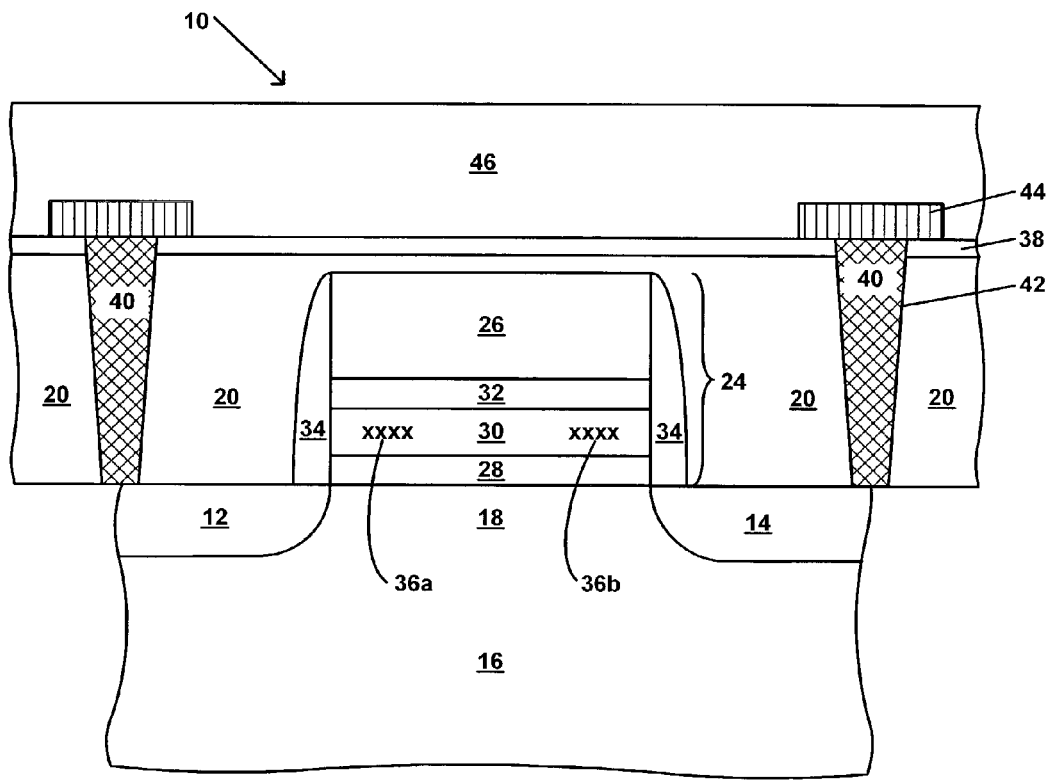
FIG. 1 schematically illustrates, in cross-section, a portion of a semiconductor substrate containing a dual-bit EEPROM transistor which includes programmed charges in the dielectric charge storage layer, in accordance with an embodiment of the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

Referring first to FIG. 1, there is schematically shown in cross-section a transistor 10, which in one embodiment is a SONOS flash memory cell, suitable for use in a dual-bit EEPROM device, such as the MIRRORBIT™, available from Advanced Micro Devices, Inc., Sunnyvale, Calif. The transistor 10 includes source/drain regions 12 and 14 located in a semiconductor substrate 16 and separated by a channel region 18. The substrate 16 may be, for example, a single crystal silicon wafer. The substrate 16 may also be or comprise gallium arsenide, silicon-on-insulator, an epitaxial layer, silicon-germanium, germanium-on-insulator, or other known semiconductor substrate. A stack gate 24 overlies the channel region 18. The stack gate 24 includes a control gate electrode 26, and an ONO structure including a bottom or tunnel oxide layer 28, a dielectric charge storage layer 30 and a top oxide layer 32, as shown in FIG. 1. In one embodiment, the dielectric charge storage layer 30 is a nitride charge storage layer. In one embodiment, the dielectric charge storage layer 30 comprises silicon nitride. In other embodiments, the dielectric charge storage layer 30 comprises other known dielectric charge storage materials such as, for example, a high-K dielectric material. Suitable high-K dielectric charge storage materials are disclosed in copending, commonly assigned application assigned U.S. Ser. No. 10/036,757, entitled USE OF HIGH-K DIELECTRIC MATERIALS IN MODIFIED ONO STRUCTURE FOR SEMICONDUCTOR DEVICES. The stack gate 24 further includes sidewall liners 34. In one embodiment, not shown, a thin oxide layer covers the stack gate 24, before the sidewall liners 34 are formed. The thin oxide layer, when present, has a thickness, for example, of about 50 angstroms, or from about 25 to about 100 angstroms. As shown in FIG. 1, charges 36a and 36b may be stored in the dielectric charge storage layer 30, which acts as a charge or electron storage layer in the SONOS or dual-bit EEPROM device.

Referring still to FIG. 1, the stack gate 24 is covered and surrounded by a first interlevel dielectric (ILD) layer 20, which also may be referred to as IDL0 ("ILD zero") layer 20. In one embodiment, the ILD0 layer 20 is silicon dioxide. In other embodiments, the ILD0 layer 20 may comprise other materials, such as boron phosphosilicate glass (BPSG) or other known materials for such layer. In the embodiment shown in FIG. 1, the ILD0 layer 20 is thicker than the height of the stack gate 24. In the embodiment shown in FIG. 1, the first ILD layer 20 is covered by a cap layer 38. In one embodiment, the cap layer 38 may also be referred to as a "C1" layer. The cap layer 38 may comprise a barrier material such as silicon nitride. In one embodiment, the cap layer 38 may be comprised of a variety of materials, such as silicon oxynitride, silicon-rich silicon dioxide, silicon-rich silicon nitride, etc., known for such use.

Referring still to FIG. 1, the transistor 10 further includes conductive connecting plugs 40, which may be, for example, tungsten plugs. The conductive plugs 40 are formed in apertures 42 in the ILD0 layer 20. The apertures 42 penetrate through the ILD0 layer 20, providing a path or via to the source 12 and/or drain 14 of the transistor 10. The transistor 10 further comprises metal electrodes 44. The metal electrodes 44 may be, for example, connecting elements (e.g., bit lines, etc.) of the transistor 10 to power sources and adjacent transistors. The conductive plugs 40 in FIG. 1 provide electrical connection between the metal electrodes 44 and the source 12 and/or drain 14. In one embodiment, not shown, the conductive plugs 40 provide electrical connection both to the source 12 of one transistor 10, and to the drain 14 of an adjacent transistor.

As shown in FIG. 1, the transistor 10 is covered by a further interlayer dielectric, which may also be referred to as ILD1 ("ILD one") layer 46. In one embodiment, the ILD1 layer 46 is silicon dioxide, or any of the other materials disclosed above with respect to the ILD0 layer 20 and the cap layer 38.

In one embodiment, the ILD1 layer 46 is silicon dioxide. In one embodiment, the ILD1 layer 46 is silicon dioxide having a general formula $SiO_x$, wherein $x \geq 2$. In one embodiment, the ILD1 layer 46 is silicon dioxide having a general formula $SiO_2$, i.e., a substantially stoichiometric silicon dioxide. In another embodiment, the ILD1 layer 46 is silicon nitride, $Si_3N_4$, i.e., a substantially stoichiometric silicon nitride. In another embodiment, the ILD1 layer 46 is silicon carbide, SiC. In another embodiment, the ILD1 layer 46 is SiCN. SiCN has been referred to under various names, such as silicon carbon nitride, silicon carbonitride and silicon cyanide. The empirical formula of SiCN varies depending on the formation conditions, but is generally considered to be analogous to $Si_3N_4$ and $C_3N_4$, in which the Si and C components are interchanged. The formula of the "interchanged" Si and C has been sometimes referred to as $(Si;C)_3N_4$. Herein, this material will be referred to simply as SiCN.

Although the foregoing structures have been described, as will be understood by persons of ordinary skill in the art, further embodiments of the charge trapping dielectric flash memory device may include additional layers. In some such embodiments, the device may include a further interlevel dielectric layer, or ILD, for example an ILD2 layer ("ILD two"), an ILD3 layer ("ILD three") or a device top dielectric layer. Such subsequent ILD layers may be applied as needed, as recognized by those of ordinary skill in the art. A device top dielectric layer covers the entire semiconductor device. In accordance with the present invention, such layers are formed by processes which do not expose the dielectric charge storage layer of the flash memory cell to levels of UV radiation which result in the formation of non-erasable charges in the dielectric charge storage layer or structure.

In one embodiment, all steps subsequent to the formation of the dielectric charge storage layer, including formation of the top oxide layer and the control gate layer, are carried out by selecting methods which do not include use of UV radiation as an activation or energy source. In one embodiment, the BEOL fabrication of each of the ILD0 layer, the ILD1 layer, the contact cap layer, and subsequently applied ILD layers and the device top dielectric layer, is carried out by selecting methods which do not include use of UV radiation as an activation or energy source. In one embodiment, the BEOL fabrication of each of the ILD0 layer, the ILD1 layer, the contact cap layer, and subsequently applied ILD layers and the top oxide layer, is carried out by methods which do not generate or result in exposure of the cell to UV radiation. In one embodiment, the BEOL fabrication of each of the ILD0 layer, the ILD 1 layer, the contact cap layer, and subsequently applied ILD layers and the top oxide layer, is carried out by a non-plasma method.

In one embodiment, one or more, or all, of the ILD0 layer, the ILD1 layer, the contact cap layer, and subsequently applied ILD layers and the top oxide layer, are not UV-opaque. In one embodiment, one or more, or all, of these layers are substantially UV transparent, down to a wavelength of about 200 nm.

In one embodiment, at least one of the layers deposited over the charge trapping dielectric flash memory cell comprises at least one low-K dielectric material. In one embodiment, the low-K dielectric layer is deposited over the charge trapping dielectric flash memory cell by a method which does not expose the charge trapping dielectric flash memory cell to a level of UV radiation sufficient to deposit a non-erasable charge in the charge trapping dielectric flash memory cell. The low-K dielectric material may be used in one or more of the aforementioned ILD0, contact cap, ILD1, ILD2, ILD3, or top oxide layers.

In one embodiment, the at least one low-K dielectric material includes one or more of parylene, polyimide, a fluoropolymer, a poly-arylene ether, SILK®, FLARE®, a porous silicate glass, an epoxy, SiCOH, benzocyclobutene (BCB), flowable oxide (FOX), 650-F, hydro polysilsesquioxane (H-PSSQ), methyl polysilsesquioxane (Me-PSSQ), phenyl polysilsesquioxane (Ph-PSSQ), and mixtures thereof.

In the operation of the exemplary dual-bit EEPROM transistor 10, voltages are applied to the gate electrode 24 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 28 into the silicon nitride charge storage layer 30. The dielectric charge storage layer may also be referred to as an electron storage layer. For example, depending upon the particular voltage levels applied to the control-gate electrode 26 and to the source/drain regions 12 and 14, the electrical charges 36a, 36b are transferred into the dielectric charge storage layer 30 and are localized to regions in proximity to either the source/drain region 12, or the source/drain region 14.

Those skilled in the art will recognize that for proper functioning of a dual-bit EEPROM device, the electrical charges 36a, 36b should remain isolated in the regions of the dielectric charge storage layer 30 to which they are initially introduced and no charge should be present prior to programming of the dielectric charge storage layer 30. Similarly, in other charge trapping dielectric flash memory cells, the charges should remain isolated in the region of the dielectric charge storage structure to which they are initially introduced and no charge should be present prior to programming of the dielectric charge storage layer 30. The proper maintenance of the condition, either programmed or not programmed, of the dielectric charge storage layer 30 is needed for the proper performance of a dual-bit EEPROM device. In particular, the present inventors have discovered that the dielectric charge storage layer 30 should be protected from incident UV radiation, which can create a charge in the dielectric charge storage layer 30. As described above, such spuriously created charges can introduce errors into stored data and even damage the dielectric charge storage layer 30. In accordance with this discovery, the present invention has been made.

As previously mentioned, the flash EEPROM memory cell 10 of FIG. 1 is programmed similarly to known flash EEPROM memory cells. Voltages are applied to the gate 26 and drain 14 creating vertical and lateral electrical fields which accelerate electrons from the source 12 along the length of the channel 18. As the electrons move along the channel 18 some of them gain sufficient energy to jump over the potential barrier of the bottom silicon dioxide layer 28 and become trapped in the dielectric charge storage layer 30. For the right bit, for example, the electron trapping occurs in a region near the drain 14 indicated by the series of "x" as the stored charge 36b in FIG. 1. Thus, the trapped charge 36b is self-aligned to the junction between the drain 14 and the substrate or channel region 18. Electrons are trapped in the portion of the dielectric charge storage 30 near but above and self-aligned with the drain region 14 because the electric fields are the strongest there. Thus, the electrons have a maximum probability of being sufficiently energized to jump the potential barrier of the silicon dioxide layer 28 and become trapped in the dielectric charge storage layer 30 near the drain 14, in the region shown in FIG. 1. The threshold voltage of the portion of the channel 18 between the source 12 and drain 14 under the region of trapped charge increases as more electrons are injected into the dielectric charge storage layer 30.

It is important to note that in order to be able to subsequently erase the memory device 10 effectively, the programming time period should be limited. As the device continues to be programmed, the width of the charge trapping region increases. If programming continues past a certain point the charge trapping region becomes too wide whereby erasing is ineffective in removing trapped charge from the dielectric charge storage layer 30. A similar but more deleterious effect occurs from exposure to UV radiation, in which not only is excess charge stored in the dielectric charge storage layer 30, but the excess charge is not localized so as to be able to be erased by routine methods such as described below.

Figure 2:
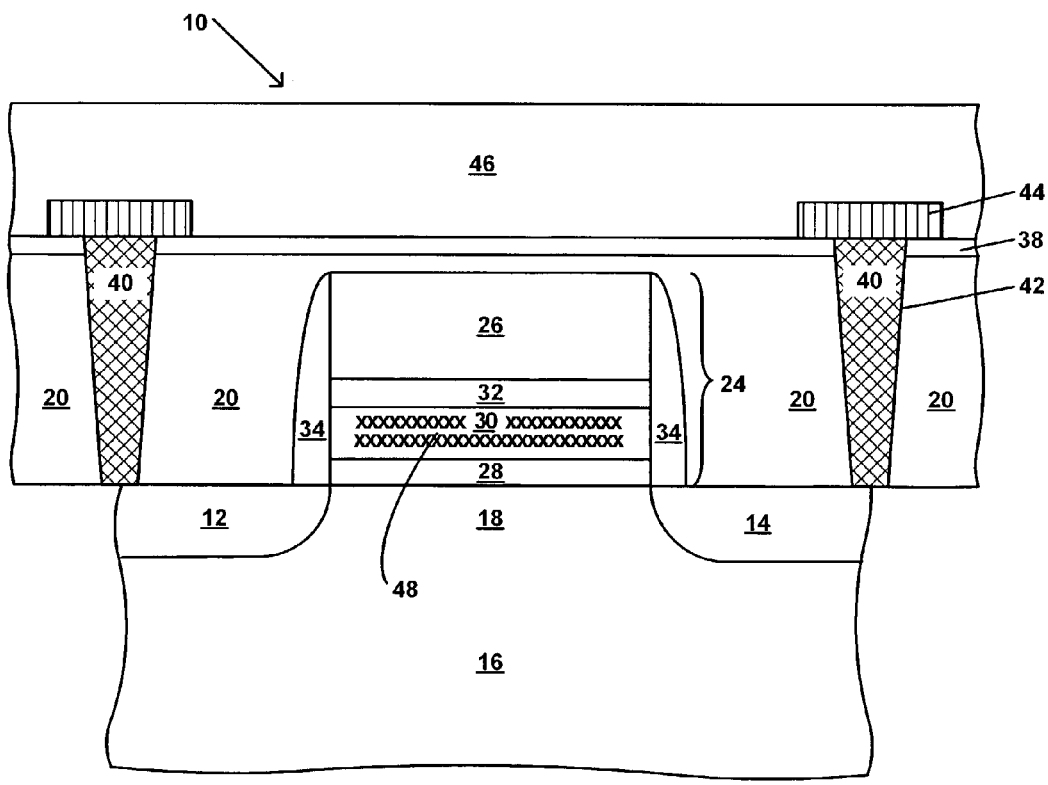
FIG. 2 schematically illustrates, in cross-section, a portion of a semiconductor substrate similar to that shown in FIG. 1, in which the device has been exposed to excess UV radiation and in which a non-erasable charge has been deposited in the dielectric charge storage layer.

FIG. 2 schematically illustrates, in cross-section, a portion of a semiconductor substrate 10 similar to that shown in FIG. 1, in which the device has been exposed to excess UV radiation and in which an excess, non-erasable charge 48 has been formed or deposited in the dielectric charge storage layer 30. FIG. 2 schematically illustrates the non-erasable charge 48 by the large number of "X" symbols, representing charges, e.g., electrons, in the dielectric charge storage layer 30. As described above, FIG. 1 illustrates a device 10 which has not been exposed to UV radiation and in which charges 36a and 36b have been stored, in accordance with the normal operation of a dual-bit flash memory device which is in contrast to the situation depicted in FIG. 2. A further, detailed description of programming and reading dual-bit flash EEPROM devices is provided, for example, in U.S. Pat. No. 6,215,702 B1. The example shown in FIG. 2 is exemplary, for demonstrating the type of charge which may be deposited in the dielectric charge storage material due to UV exposure during BEOL processing.

As used herein, a non-erasable charge is a charge which cannot be erased by usual procedures, e.g., when a voltage sufficient to erase a bit of data written in the cell is applied to the charge trapping dielectric flash memory cell, by methods which are commonly used and which allow for efficient use of, and avoid damage to, the memory cell.

A number of methods of erasing charge trapping dielectric flash memory cells are known. Several are briefly reviewed in the following, to provide a better understanding of how a properly programmed dual-bit flash EEPROM memory device is programmed and why exposure to UV radiation is deleterious to proper operation of such memory devices.

The mechanism used to erase the two bit flash EEPROM memory cell of FIG. 1 involves the movement of electrons as opposed to the movement of holes. For the right bit, an erase is performed by removing electrons from the dielectric charge storage layer 30 either through the gate 26 via the top oxide 32 or through the drain 14 via the bottom oxide 28. For the left bit, an erase is performed by removing electrons from the dielectric charge storage layer 30 either through the gate 26 via the top oxide 32 or through the source 12 via the bottom oxide 28.

Using the right bit as an example, one technique of erasing is to simultaneously apply a positive voltage potential to the gate 26 and zero potential, i.e., ground, to the drain 14 such that electron tunneling occurs from the dielectric charge storage layer 30 through the top oxide 32 to the gate 26. The right bit is erased in a similar fashion with zero potential applied to the source 14. In this case, the top oxide 32 is suitably constructed to optimize the tunneling of electrons from the dielectric charge storage layer 30 into the gate 24 in order to facilitate the erasing of the memory cell 10. In one embodiment, the voltage applied to the gate 26 is in the range of about 10 to about 18 volts.

Using the right bit as an example, a second technique of erasing the memory cell of FIG. 1 is to simultaneously apply a negative potential to the gate 26 and a positive potential to the drain 14 such that electron tunneling occurs from the dielectric charge storage layer 30 to the drain 14 via the bottom oxide 28. The left bit is erased in a similar fashion except that a positive potential is applied to the source 12 rather than the drain 14. The electron tunneling is substantially confined to a local area near the drain 14. To facilitate the erasing of the memory cell 10 using this technique, the thickness of the bottom oxide layer 28 is suitably constructed to optimize the removal of electrons from the dielectric charge storage layer 30 into the drain 14.

Referring still to FIG. 1, the second erasing technique involves simultaneously applying at time $T_1$ a first positive voltage pulse $V_{D1}$ to the drain and a first negative voltage pulse $V_{G1}$ at the gate. After the voltages are applied to the drain and gate, it is determined whether or not the cell has been erased. If it has not, a second positive voltage pulse $V_{D2}$ is applied to the drain and a second negative voltage pulse $V_{G2}$ at the gate at time $T_2$. Again, it is determined whether or not the cell has been erased. If it has not, the cycle is repeated until the cell is erased. In this embodiment, the magnitude of the drain voltages and the gate voltages are unchanged during each cycle.

A third technique of erasing the memory cell of FIG. 1 that is related to the second technique but reduces the likelihood of cell degradation is described in U.S. Pat. No. 6,266,281. Like the second erasing technique, the third erasing technique involves simultaneously applying at time $T_1$ a first positive voltage pulse $V_{D1}$ having a magnitude of approximately 3V to 6V and a pulse width ranging from 1 ms to 500 ms to the drain and a first negative voltage pulse $V_{G1}$ of approximately −1V at the gate. After the voltages are applied to the drain and gate, it is determined whether or not the cell has been erased. If the cell is erased, then the erasure technique is discontinued. If it is not, a second positive voltage pulse $V_{D2}$ is applied to the drain and a second negative voltage pulse $V_{G2}$ at the gate at time $T_2$. While the magnitude of the drain voltage remains unchanged like the second technique, the magnitude of the second negative voltage pulse at the gate is greater than the magnitude of the first negative voltage pulse so that a deeper erasure is performed in the second cycle. The magnitude of the second negative pulse has a magnitude of approximately 1.2V. If it is determined after the application of the second negative pulse that the cell is erased, then the erasing technique is discontinued. However, if the cell is found not to be erased, then the magnitude of the gate voltage will be increased once again at time $T_3$ to deepen the erase once again. Since the gate voltage is ramped in the manner described above, the cell is erased in fewer cycles than in the second technique and so the cell is less degraded when subjected to the third erasing technique than the second erasing technique.

Other methods of erasing dual-bit or multi-bit charge trapping dielectric flash memory cells are known in the art. For example, the foregoing and other methods of erasing such dual-bit flash EEPROM cells are disclosed in U.S. Pat. No. 6,215,702 B1.

As is evident from the foregoing descriptions of erasing dual-bit flash EEPROM memory cells, if too large a charge is in the dielectric charge storage layer 30, or if the charge is located outside the regions in FIG. 1 in which the stored charges 36a and 36b are shown, erasing the charge trapping dielectric flash memory cell becomes difficult or impossible. Such a large or spread-out charge such as the non-erasable charge 48 can result from exposure to UV radiation after the dielectric charge storage layer 30 is formed during fabrication of the device 10. If this charge cannot be erased, the charge trapping dielectric flash memory device may be rendered defective or useless.

In accordance with the invention, unwanted charge buildup in the dielectric charge storage layer 30 from incident UV radiation is minimized by protecting the charge trapping dielectric flash memory cell from UV radiation during BEOL processing. The protection from such spurious excess charges in and the improved performance of dual-bit EEPROM devices obtained by the present invention can be better understood following a description of a fabrication processes used in BEOL processes in accordance with the invention.

As used herein, the term BEOL, or back-end-of-line, means any process steps carried out after the dielectric charge storage material layer is deposited in the nascent charge trapping dielectric flash memory cell fabrication process. Since the dielectric charge storage layer is subject to deposition or formation of an unwanted, excess non-erasable charge at any time after it is formed, in accordance with the present invention, the device or, at least the layer 30, should be protected from exposure to excess UV radiation after the dielectric charge storage layer 30 has been formed.

Figure 3:
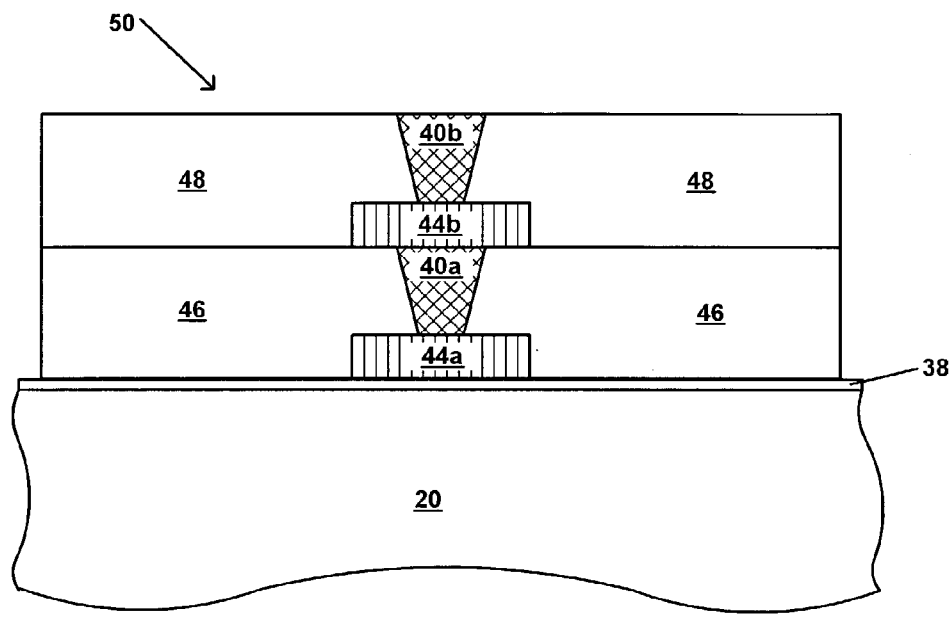
FIG. 3 schematically illustrates, in cross-section, a portion of a semiconductor substrate which incorporates two interlevel dielectric layers, fabricated in accordance with an embodiment of the present invention.

FIG. 3 schematically illustrates, in cross-section, a portion of a semiconductor substrate 50 which incorporates two interlevel dielectric layers, fabricated in accordance with an embodiment of the present invention. FIG. 3 shows a portion of a semiconductor device 50, which may include, for example, a transistor such as those described with respect to FIGS. 1 and 2. The structure shown in FIG. 3 depicts layers applied during BEOL processing. The device 50 includes a first interlevel dielectric layer 20 (ILD0 layer 20), which may be disposed in a layer covering a stack gate (not shown) or other structure of a semiconductor device. The ILD0 layer 20 of FIG. 3 is substantially the same as that described above with respect to the embodiments shown in FIGS. 1 and 2. The device 50 further includes a contact cap layer 38, which is substantially the same as that described above with respect to the embodiments shown in FIGS. 1 and 2. The device 50 shown in FIG. 3 includes a first conductive plug 40a and a second conductive plug 40b. The device 50 shown in FIG. 3 also includes a first conductive metal 44a and a second conductive metal 44b. The first conductive plug 40a provides electrical connection between the first conductive metal 44a and the second conductive metal 44b. The second conductive plug 40b provides electrical connection between the second conductive metal 44b and an external power source or other device (not shown).

The semiconductor device 50 shown in FIG. 3 includes two ILD layers. The device 50 includes a first ILD layer 46, and a second ILD layer 48. In one embodiment, both the first ILD layer 46 and the second ILD layer 48 are substantially the same as the ILD layer 46 described above with respect to FIGS. 1 and 2, with respect to materials, thicknesses, functions, etc.

In one embodiment, the first ILD layer 46 shown in FIG. 3 is a second interlevel dielectric layer, designated ILD1. In one embodiment, the second ILD layer 48 shown in FIG. 3 is a third interlevel dielectric layer, designated ILD2. In one embodiment, both the first and second ILD layers 46 and 48 shown in FIG. 3 are substantially UV transparent, and in another embodiment, both the first and second ILD layers 46 and 48 are substantially not UV opaque.

In one embodiment, each of the ILD layers shown in FIG. 3 has been deposited by methods which do not include use, generation or exposure of the semiconductor device to a level of UV radiation sufficient to deposit a non-erasable charge in an underlying dielectric charge storage layer.

In one embodiment, the BEOL fabrication of each of the ILD layers shown in FIG. 3, and any subsequently applied ILD layers and top oxide layer, is carried out by selecting methods which do not include use of UV radiation as an activation or energy source. In one embodiment, the BEOL fabrication of each of the ILD layers shown in FIG. 3, and any subsequently applied ILD layers and top oxide layer, is carried out by methods which do not generate or result in exposure of the cell to UV radiation. In one embodiment, the BEOL fabrication of each of the ILD layers shown in FIG. 3, and any subsequently applied ILD layers and top oxide layer, is carried out by a non-plasma method.

Figure 9:
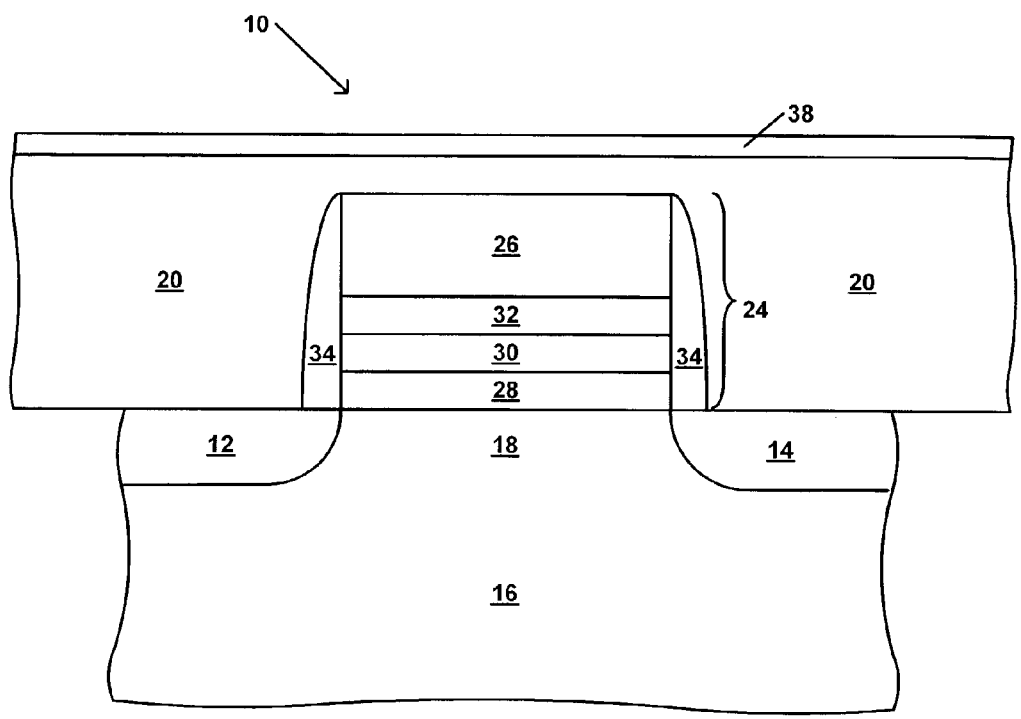
Figure 10:
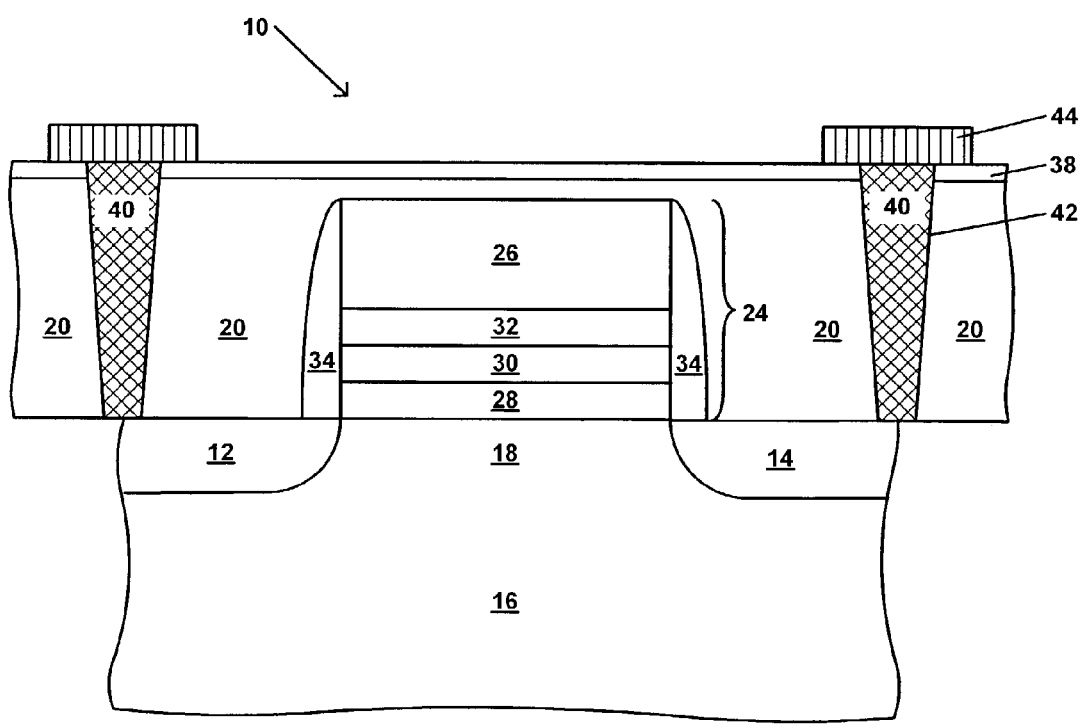
Figure 11:
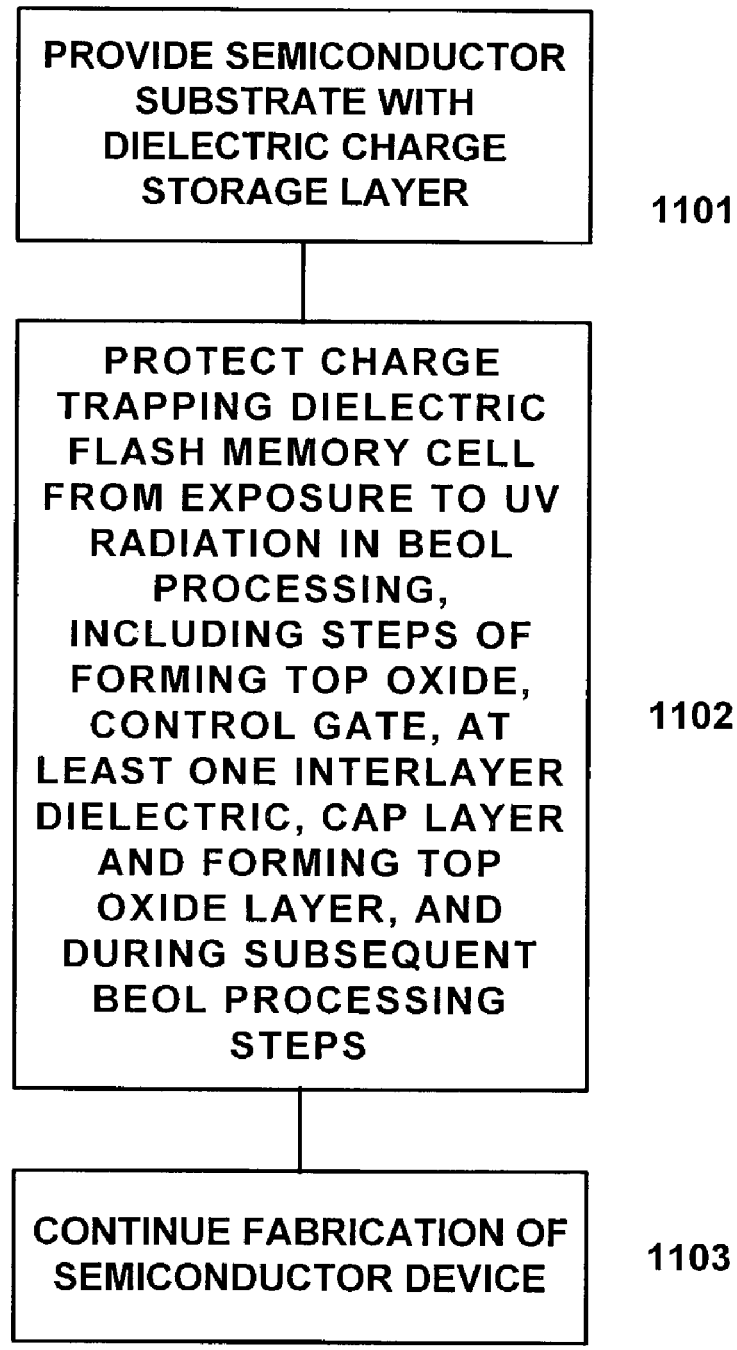
FIG. 11 is a schematic flow diagram showing the steps of an embodiment of the present invention.

Fabrication of a Charge Trapping Dielectric Flash Memory Device Including BEOL Processes Free of UV The following description of the present invention follows with reference to FIGS. 4–11. FIGS. 4–10 are schematic cross-sectional diagrams depicting structures obtained in sequential steps in fabrication of an exemplary charge trapping dielectric flash memory device, such as that shown in FIG. 1, in accordance with the present invention. FIG. 11 is a schematic flow diagram showing the steps of an embodiment of a process in accordance with the present invention. It is a feature of the present invention that steps of the presently described fabrication process subsequent to formation of the charge trapping dielectric layer 30 are carried out by methods which do not include use, generation or exposure of the dielectric charge storage layer 30 to a level of UV radiation sufficient to deposit a non-erasable charge in the dielectric charge storage layer 30.

Figure 4:
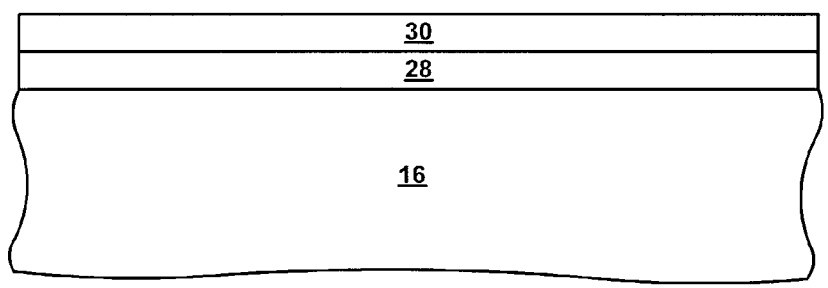
FIGS. 4–10 are schematic cross-sectional diagrams depicting steps in fabrication of an exemplary charge trapping dielectric flash memory device, such as that shown in FIG. 1, in accordance with the present invention.

In the first step of a process in accordance with the present invention, shown schematically in FIG. 11 as step 1101, a semiconductor substrate 16 with a bottom oxide layer 28 and a charge trapping dielectric layer 30 fabricated thereon is provided, as shown in FIG. 4. The bottom oxide layer 28 and the charge trapping dielectric layer 30 may be fabricated by any appropriate methods known in the art, as appropriate to the dielectric materials of which these layers are formed. Since methods for deposition of such layers 28 and 30 are known, for the sake of brevity such are not disclosed in detail herein.

An example of such a substrate 16 is shown in FIG. 4. Therein, the semiconductor substrate 16 has had a bottom oxide layer 28 formed thereover. A dielectric charge trapping dielectric layer 30 overlies the bottom oxide layer 28. In accordance with the present invention, during the process steps following formation of the dielectric charge storage layer 30, the layer 30 is protected from exposure to UV radiation. As described hereinafter, in one embodiment, the protection includes selection of deposition methods which do not include the use, generation or exposure of the charge storage layer 30 to a level of UV radiation sufficient to deposit a non-erasable charge in the charge storage layer 30.

Conventionally such layers formed after the charge storage layer have been formed without regard to exposure of the device to UV radiation, since devices generally were not susceptible to damage by exposure to UV radiation, and the problem was not recognized. The present inventors first discovered that in charge trapping dielectric flash memory devices, if the dielectric charge storage layer is exposed to UV radiation, it can be damaged thereby, when a non-erasable charge is stored therein as a result of the exposure. Accordingly, the present invention provides methods for forming such layers without the use of processes which include the use, generation or exposure of the charge storage layer to UV radiation at a level which can result in such damage.

In the second step of the process in accordance with the present invention, shown schematically in FIG. 11 as step 1102, the steps subsequent to formation of the charge trapping dielectric layer 30 are carried out so as to protect the charge trapping dielectric layer 30 of the flash memory cell from exposure to a level of UV radiation sufficient to deposit a non-erasable charge in the flash memory cell. In one embodiment, the step 1102 comprises substantially all subsequent steps in the BEOL fabrication steps of the process.

In one embodiment, each layer deposited subsequent to the charge trapping dielectric layer 30 is deposited by "non-UV" processes, i.e., processes which do not include use, or generation of, or exposure of the device to, UV radiation. Such processes include APCVD, CVD and spin-on dielectric. In other embodiments, other suitable, non-UV CVD processes can be suitably selected by those of ordinary skill in the art. Thus, in general, thermally-activated CVD processes are favored, as opposed to CVD processes which include use, generation or exposure of the dielectric charge storage layer to a level of UV radiation which can result in deposition of a non-erasable charge in the layer. In one embodiment, the CVD method is other than PECVD. PECVD is commonly used in conventional BEOL processes. As described above, the present inventors have discovered that charge trapping dielectric flash memory devices can be irreversibly damaged by exposure to the UV radiation which is conventionally used in BEOL process steps for other semiconductor devices. PECVD is one such conventional process.

Figure 5:
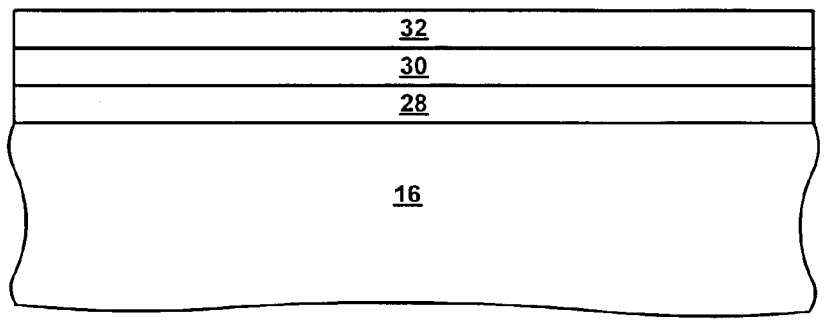

FIG. 5 is a schematic cross-sectional diagram depicting a device 10, such as that shown in FIG. 4, following deposition of a top oxide layer 32, which has been deposited over the dielectric charge storage layer 30, as depicted in FIG. 5. In one embodiment, the processes by which the top oxide layer 32 has been deposited and subsequently etched do not include use, generation or exposure of the dielectric charge storage layer 30 to a level of UV radiation sufficient to deposit a non-erasable charge in the flash memory cell of the device 10.

Figure 6:
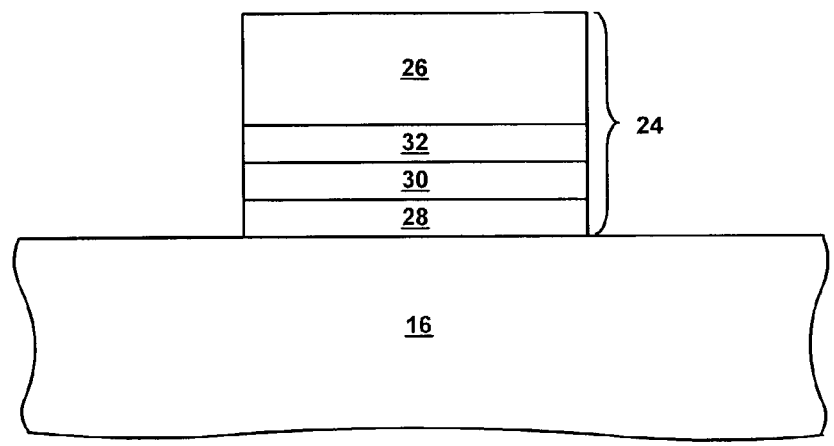

FIG. 6 is a schematic cross-sectional diagram depicting a device 10, such as that shown in FIG. 5, following deposition of a control gate layer 26, which has been deposited over the top oxide layer 32, and then etched to form the stack gate 24 depicted in FIG. 6. In one embodiment, the processes by which the control gate layer 26 has been deposited and subsequently etched do not include use, generation or exposure of the dielectric charge storage layer 30 to a level of UV radiation sufficient to deposit a non-erasable charge in the flash memory cell of the device 10.

At a suitable point in the process, for example, after the stack gate 24 has been formed by etching the layers of which it is formed, the source 12 and drain 14 are formed by suitably selected processes, such as a self-aligned implantation.

Figure 7:
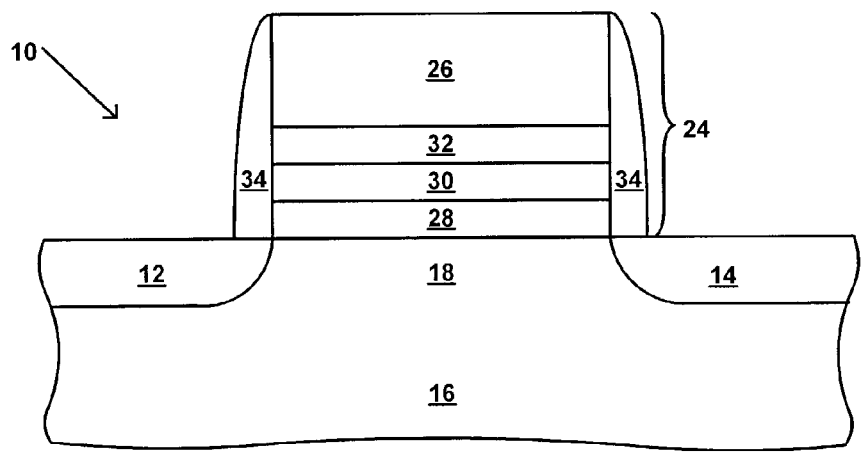

FIG. 7 is a schematic cross-sectional diagram depicting a device 10, such as that shown in FIG. 6, following formation of the source 12 and drain 14 and deposition of a dielectric material layer 34, which has been deposited and then etched to form the sidewall structures 34 depicted in FIG. 7. In one embodiment, the processes by which the source 12 and drain 14 have been formed, and by which the dielectric material layer 34 has been deposited and subsequently etched do not include use, generation or exposure of the dielectric charge storage layer 30 to a level of UV radiation sufficient to deposit a non-erasable charge in the flash memory cell of the device-10.

Figure 8:
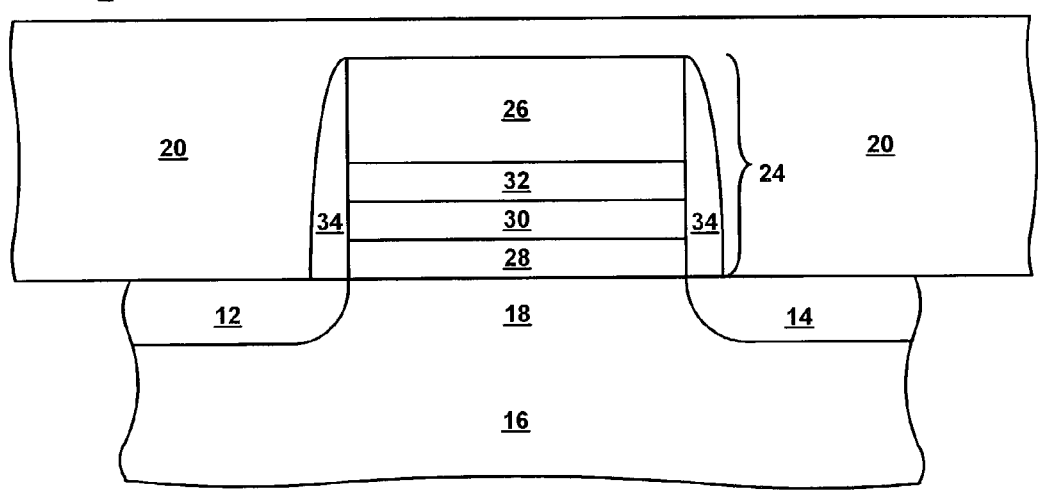

FIG. 8 is a schematic cross-sectional diagram depicting a device 10, such as that shown in FIGS. 6 and 7, following deposition of a first interlayer dielectric layer 20 over the stack gate 24 and sidewalls 34. In one embodiment, the layer 20 is an ILD0 layer. In one embodiment, the processes by which the first interlayer dielectric layer 20 has been deposited and subsequently etched do not include use, generation or exposure of the dielectric charge storage layer 30 to a level of UV radiation sufficient to deposit a non-erasable charge in the flash memory cell of the device 10.

FIG. 9 is a schematic cross-sectional diagram depicting a device 10, such as that shown in FIGS. 4–8, following deposition of a contact cap layer 38, which has been deposited over the first interlayer dielectric layer 20. In one embodiment, the processes by which the contact cap layer 38 has been deposited and subsequently etched do not include use or exposure of the dielectric charge storage layer 30 to a level of UV radiation sufficient to deposit a non-erasable charge in the flash memory cell of the device 10.

FIG. 10 is a schematic cross-sectional diagram depicting a device 10, such as that shown in FIG. 9, following formation of apertures 42, conductive plugs 40 and metal electrodes 44. The apertures 42 penetrate through the ILD0 layer 20, providing a path or via to the source 12 and/or drain 14 of the device 10. The conductive plugs 40 fill the apertures 42, providing a conductive connection to the source 12 and/or drain 14. The metal electrodes 44 provide electrical connection from the conductive plugs 40 to other portions of the semiconductor device 10. In one embodiment, the processes by which the apertures 42, the conductive plugs 40 and the metal electrodes 44 have been formed and subsequently etched do not include use, generation or exposure of the dielectric charge storage layer 30 to a level of UV radiation sufficient to deposit a non-erasable charge in the flash memory cell of the device 10.

Following formation of the device 10 shown in FIG. 10, a second interlevel dielectric layer 46, which may be designated ILD1, such as the layer 46 shown in FIG. 1, is deposited over the device. In one embodiment, the processes by which the ILD1 layer 46 is deposited and, in some embodiments subsequently etched, do not include use, generation or exposure of the dielectric charge storage layer 30 to a level of UV radiation sufficient to deposit a non-erasable charge in the flash memory cell of the device 10.

In one embodiment (not shown), a third interlevel dielectric layer, ILD2, is deposited over the second interlevel dielectric layer. The ILD2 layer would be substantially similar to the ILD0 layer 20 and ILD1 layer 46, shown in FIG. 1, and to the ILD2 layer 48 shown in FIG. 3. In one embodiment, following formation of the second or third ILD layer, a top oxide layer (not shown) may also be formed. The need for, and formation of such additional layers can be appropriately determined by those of ordinary skill in the art. In one embodiment, the processes by which such additional layers are deposited and, in some embodiments subsequently etched, do not include use, generation or exposure of the dielectric charge storage layer 30 to a level of UV radiation sufficient to deposit a non-erasable charge in the flash memory cell of the device 10.

Following formation of the various layers in accordance with the present invention, the semiconductor device and the charge trapping dielectric flash memory cell are further processed in subsequent BEOL processes, to complete the fabrication of the device, as appropriate, as indicated in step 1103 in FIG. 11. In furtherance of the present invention, in one embodiment, steps are taken and processes chosen in such subsequent BEOL processing, to protect the device and the charge trapping dielectric flash memory cell from exposure to UV radiation. In all such embodiments, it is desirable to protect the device and the charge trapping dielectric flash memory cell from such exposure.

Thus, as described in the foregoing, in accordance with the present invention, the semiconductor device and the charge trapping dielectric flash memory cell are protected from exposure to UV radiation during the processing steps subsequent to formation of the charge trapping dielectric layer. In another embodiment, the semiconductor device and the charge trapping dielectric flash memory cell are protected from exposure to UV radiation during the processing steps subsequent to formation of the dielectric charge storage structures, such as the ONO portions of the stack gate. In one embodiment, the semiconductor device and the charge trapping dielectric flash memory cell are protected from exposure to UV radiation during the processing steps subsequent to formation of the dielectric charge storage layer. In one embodiment, the protection from UV radiation at and beyond these points in the fabrication process comprises the herein described formation of one or more UV protective layers, as described in commonly assigned, copending U.S. application Ser. No. 10/358,589, filed Feb. 5, 2003, now U.S. Pat. No. 6,774,434, entitled UV-BLOCKING LAYER FOR REDUCING UV-INDUCED CHARGING OF SONOS DUAL-BIT FLASH MEMORY DEVICES IN BEOL PROCESSING, the disclosure of which is hereby incorporated herein by reference for its teachings relating to such UV-blocking layers. In another embodiment, the protection from UV radiation further comprises shielding or otherwise avoiding exposure to UV radiation. In another embodiment, the protection from UV radiation further comprises selection and use of non-UV processes, as described above.

INDUSTRIAL APPLICABILITY

The present invention, by protecting the device from UV-induced charging, overcomes the problem of UV-induced charging of charge trapping dielectric flash memory cells, particularly during BEOL processing. The present invention provides advantages such as (1) selection of processes which do not use, generate or expose the device to UV radiation; (2) protecting the charge trapping dielectric flash memory cell from UV-induced charging; (3) a process modification which can be easily accommodated in presently employed fabrication processes; and (4) providing alternative low-K interlevel dielectric layers. Thus, the present invention provides an advance in ONO fabrication technology, and insures proper charge isolation in dielectric charge storage material structures, such as ONO structures in charge trapping dielectric flash memory devices, while at the same time providing distinct process and economic advantages. Although described in terms of, and particularly applicable to, SONOS flash memory devices, the present invention is broadly applicable to fabrication of any semiconductor device that includes a dielectric charge storage layer subject to unwanted UV charging.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A method of protecting a charge trapping dielectric flash memory cell from UV-induced charging, comprising:
    fabricating a charge trapping dielectric flash memory cell including a charge trapping dielectric charge storage layer in a semiconductor device; and
    during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell.

2. The method of claim 1, wherein the step of protecting is carried out by selecting processes in BEOL fabrication which do not include use, generation or exposure of the semiconductor device to a level of UV radiation sufficient to deposit the non-erasable charge.

3. The method of claim 2, wherein the BEOL fabrication is carried out by selecting methods which do not include use of UV radiation as an activation or energy source.

4. The method of claim 2, wherein the BEOL fabrication is carried out by methods which do not generate or result in exposure of the cell to UV radiation.

5. The method of claim 2, wherein the BEOL fabrication is carried out by a non-plasma method.

6. The method of claim 1, wherein the non-erasable charge is a charge which cannot be erased when a voltage sufficient to erase a bit of data written in the cell is applied to the charge trapping dielectric flash memory cell.

7. The method of claim 1, further comprising depositing at least one layer comprising at least one low-K dielectric material over the charge trapping dielectric flash memory cell by a method which does not expose the charge trapping dielectric flash memory cell to a level of UV radiation sufficient to deposit a non-erasable charge in the charge trapping dielectric flash memory cell.

8. The method of claim 7, wherein the at least one low-K dielectric material comprises parylene, polyimide, a fluoropolymer, a poly-arylene ether, SILK®, FLARE®, a porous silicate glass, an epoxy, SiCOH, benzocyclobutene (BCB), flowable oxide (FOX), 650-F, hydro polysilsesquioxane (H-PSSQ), methyl polysilsesquioxane (Me-PSSQ), phenyl polysilsesquioxane (Ph-PSSQ), and mixtures thereof.

9. The method of claim 1, wherein the subsequent processing is BEOL processing.

10. The method of claim 1, wherein the subsequent processing steps comprise formation of one or more of an interlayer dielectric layer, a cap layer and a top dielectric layer.

11. The method of claim 10, wherein the subsequent processing steps are carried out by APCVD, CVD or a spin-on method.

12. A method of protecting a charge trapping dielectric flash memory cell from UV-induced charging, comprising:
    fabricating a charge trapping dielectric flash memory cell including a charge trapping dielectric charge storage layer in a semiconductor device; and
    during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell,
    wherein the subsequent processing steps comprise deposition over the charge trapping dielectric flash memory cell of one or more of an interlayer dielectric layer, a cap layer and a top dielectric layer by APCVD, CVD or a spin-on method.

13. The method of claim 12, wherein the BEOL fabrication is carried out by selecting methods which do not include use of UV radiation as an activation or energy source.

14. The method of claim 12, wherein the BEOL fabrication is carried out by methods which do not generate or result in exposure of the cell to UV radiation.

15. The method of claim 12, wherein the BEOL fabrication is carried out by a non-plasma method.

16. The method of claim 15, wherein the at least one low-K dielectric material comprises parylene, polyimide, a fluoropolymer, a poly-arylene ether, SILK®, FLARE®, a porous silicate glass, an epoxy, SiCOH, benzocyclobutene (BCB), flowable oxide (FOX), 650-F, hydro polysilsesquioxane (H-PSSQ), methyl polysilsesquioxane (Me-PSSQ), phenyl polysilsesquioxane (Ph-PSSQ), and mixtures thereof.

17. The method of claim 12, wherein at least one of the interlayer dielectric layer, cap layer or top dielectric layer comprises at least one low-K dielectric material deposited over the charge trapping dielectric flash memory cell by a non-plasma method.

18. The method of claim 12, wherein the non-erasable charge is a charge which cannot be erased when a voltage sufficient to erase a bit of data written in the cell is applied to the charge trapping dielectric flash memory cell.

19. A method of protecting a charge trapping dielectric flash memory cell from UV-induced charging, comprising:
    fabricating a charge trapping dielectric flash memory cell including a charge trapping dielectric charge storage layer in a semiconductor device; and
    during processing steps subsequent to formation of the charge trapping dielectric charge storage layer, protecting the charge trapping dielectric flash memory cell from exposure to a level of UV radiation sufficient to deposit a non-erasable charge in the charge trapping dielectric flash memory cell, wherein the non-erasable charge is a charge which cannot be erased when a voltage sufficient to erase a bit of data written in the cell is applied to the charge trapping dielectric flash memory cell,
    wherein the processing steps subsequent to formation of the charge trapping dielectric charge storage layer comprise deposition over the charge trapping dielectric flash memory cell of one or more of an interlayer dielectric layer, a cap layer and a top dielectric layer by APCVD, CVD or a spin-on method, and at least one of the interlayer dielectric layer, cap layer or top dielectric layer comprises at least one low-K dielectric material deposited over the charge trapping dielectric flash memory cell by a non-plasma method.

20. The method of claim 19, wherein the at least one low-K dielectric material comprises parylene, polyimide, a fluoropolymer, a poly-arylene ether, SILK®, FLARE®, a porous silicate glass, an epoxy, SiCOH, benzocyclobutene (BCB), flowable oxide (FOX), 650-F, hydro polysilsesquioxane (H-PSSQ), methyl polysilsesquioxane (Me-PSSQ), phenyl polysilsesquioxane (Ph-PSSQ), and mixtures thereof.

* * * * *

UNITED STATES PATENT AND TRADEMARK OFFICE
CERTIFICATE OF CORRECTION

| | | |
|---|---|---|
| PATENT NO. | : 7,118,967 B1 | Page 1 of 1 |
| APPLICATION NO. | : 10/368696 | |
| DATED | : October 10, 2006 | |
| INVENTOR(S) | : Ngo et al. | |

It is certified that error appears in the above-identified patent and that said Letters Patent is hereby corrected as shown below:

Title Page
Assignee (Field 73), please replace "Spansion, LLC" with --Spansion LLC--.

Signed and Sealed this

Twentieth Day of February, 2007

JON W. DUDAS
*Director of the United States Patent and Trademark Office*